United States Patent
Campochiaro et al.

(10) Patent No.: US 9,318,395 B2
(45) Date of Patent: Apr. 19, 2016

(54) SYSTEMS AND METHODS FOR PREPARATION OF SAMPLES FOR SUB-SURFACE DEFECT REVIEW

(71) Applicant: KLA-TENCOR CORPORATION, Milpitas, CA (US)

(72) Inventors: Cecelia Campochiaro, Sunnyvale, CA (US); Hong Xiao, Pleasanton, CA (US); Michael Van Riet, Sunnyvale, CA (US); Benjamin James Thomas Clarke, Milpitas, CA (US); Harsh Sinha, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 299 days.

(21) Appl. No.: 13/687,244

(22) Filed: Nov. 28, 2012

(65) Prior Publication Data

US 2013/0137193 A1    May 30, 2013

Related U.S. Application Data

(60) Provisional application No. 61/564,733, filed on Nov. 29, 2011.

(51) Int. Cl.
*H01J 37/31* (2006.01)
*H01L 21/66* (2006.01)
*H01J 37/28* (2006.01)

(52) U.S. Cl.
CPC ............ *H01L 22/20* (2013.01); *H01J 37/28* (2013.01); *H01J 37/31* (2013.01); *H01L 22/12* (2013.01); *H01J 2237/2817* (2013.01)

(58) Field of Classification Search
CPC ... H01J 37/31; H01J 37/28; H01J 2237/2817; H01L 22/12; H01L 22/20
USPC ...................................... 250/307, 310; 438/5
See application file for complete search history.

(56) References Cited

U.S. PATENT DOCUMENTS 5,561,293 A * 10/1996 Peng ................... H01J 37/3005
250/307
6,122,562 A * 9/2000 Kinney ............. H01L 21/67282
700/121

(Continued)

FOREIGN PATENT DOCUMENTS

KR    10-2007-0069810 A    7/2007
KR    10-2010-0062400 A    6/2010

OTHER PUBLICATIONS

PCT International Search Report for Application No. PCT/US2012/066887, Mar. 26, 2013, 9 sheets.

(Continued)

*Primary Examiner* — Wyatt Stoffa
(74) *Attorney, Agent, or Firm* — Okamoto & Benedicto LLP

(57) ABSTRACT

One embodiment relates to a method of preparation of a sample of a substrate for sub-surface review using a scanning electron microscope apparatus. A defect at a location indicated in a first results file is re-detected, and the location of the defect is marked with at least one discrete marking point having predetermined positioning relative to the location of the defect. The location of the defect may be determined relative to the design for the device, and a cut location and a cut angle may be determined in at least a partly-automated manner using that information. Another embodiment relates to a system for preparing a sample for sub-surface review. Another embodiment relates to a method for marking a defect for review on a target substrate. Other embodiments, aspects and feature are also disclosed.

20 Claims, 9 Drawing Sheets

(56) References Cited

U.S. PATENT DOCUMENTS

| | | | |
|---|---|---|---|
| 6,453,063 B1* | 9/2002 | Phaneuf | G01N 23/04 382/145 |
| 6,548,811 B1 | 4/2003 | Nakamura et al. | |
| 6,559,457 B1* | 5/2003 | Phan | G01N 21/9501 250/398 |
| 7,020,853 B2* | 3/2006 | Skoll | G06F 17/5081 716/111 |
| 7,072,786 B2 | 7/2006 | Coldren et al. | |
| 7,088,852 B1* | 8/2006 | Bruce | G01N 23/2251 382/145 |
| 7,676,077 B2* | 3/2010 | Kulkarni | G06F 17/5045 382/144 |
| 8,455,821 B2* | 6/2013 | Arjavac | G01N 1/32 250/304 |
| 2002/0153916 A1* | 10/2002 | Lee | H01L 23/544 324/759.02 |
| 2003/0067496 A1 | 4/2003 | Tasker et al. | |
| 2003/0098416 A1* | 5/2003 | Shemesh | H01J 37/304 250/309 |
| 2003/0155927 A1* | 8/2003 | Pinto | G01N 21/66 324/501 |
| 2004/0129878 A1* | 7/2004 | Tomimatsu | H01J 37/3056 250/307 |
| 2005/0023709 A1* | 2/2005 | Chien | G03F 9/7076 257/797 |
| 2005/0035306 A1* | 2/2005 | Iwasaki | H01J 37/20 250/492.2 |
| 2006/0219953 A1* | 10/2006 | Carleson | G01N 23/2251 250/492.21 |
| 2006/0226376 A1* | 10/2006 | Fujii | H01J 37/21 250/492.21 |
| 2007/0222464 A1 | 9/2007 | Honda et al. | |
| 2008/0135752 A1* | 6/2008 | Motoi | G01N 1/32 250/309 |
| 2008/0289754 A1* | 11/2008 | Sone | C23C 14/042 156/272.2 |
| 2008/0290291 A1* | 11/2008 | Kaga | G01N 1/286 250/453.11 |
| 2008/0309927 A1* | 12/2008 | Grueneberg | G01N 21/9503 356/237.1 |
| 2009/0121152 A1* | 5/2009 | Obara | H01J 37/222 250/442.11 |
| 2009/0230303 A1* | 9/2009 | Teshima | H01J 37/28 250/310 |
| 2010/0092070 A1* | 4/2010 | Young | G06T 7/0042 382/151 |
| 2010/0119144 A1* | 5/2010 | Kulkarni | H01L 21/67005 382/149 |
| 2010/0177954 A1* | 7/2010 | Ando | G06T 7/001 382/145 |
| 2010/0215868 A1* | 8/2010 | Iwasaki | G01N 23/2202 427/553 |
| 2011/0006207 A1* | 1/2011 | Arjavac | G01N 1/32 250/307 |
| 2011/0251713 A1* | 10/2011 | Teshima | H01J 37/28 700/110 |
| 2011/0260058 A1* | 10/2011 | Shindo | G01B 15/04 250/307 |
| 2011/0286656 A1* | 11/2011 | Kulkarni | H01L 21/67005 382/144 |
| 2012/0087569 A1* | 4/2012 | O'Dell | G01N 21/9501 382/149 |
| 2012/0328151 A1* | 12/2012 | Warschauer | G06T 7/0042 382/103 |
| 2013/0206983 A1* | 8/2013 | Yin | H01J 37/20 250/307 |
| 2013/0228685 A1* | 9/2013 | Obara | H01J 37/222 250/310 |
| 2013/0267047 A1* | 10/2013 | Shih | G03F 7/705 348/14 |
| 2013/0341505 A1* | 12/2013 | Arjavac | G01N 1/32 250/307 |
| 2014/0107959 A1* | 4/2014 | Kimba | H01J 37/28 702/95 |

OTHER PUBLICATIONS

Extended European Search Report for EP Application No. 12 85 2562.3, Jun. 24, 2015, 8 sheets.

* cited by examiner

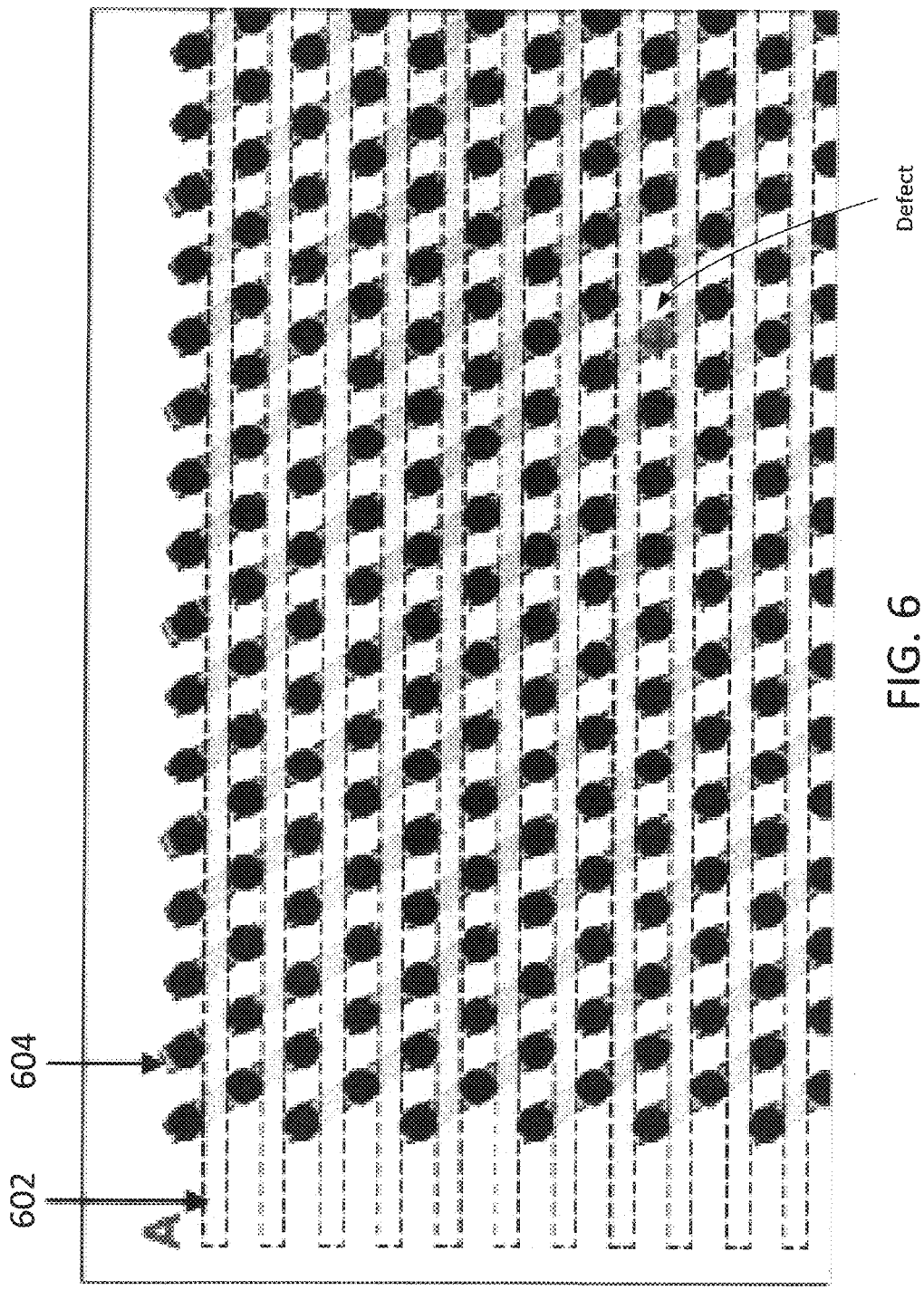

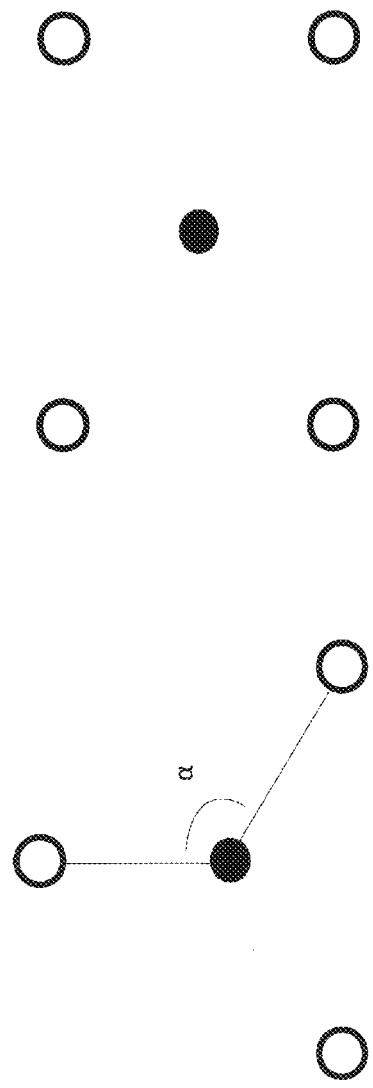

SYSTEMS AND METHODS FOR PREPARATION OF SAMPLES FOR SUB-SURFACE DEFECT REVIEW

CROSS-REFERENCE TO RELATED APPLICATION(S)

The present application claims the benefit of provisional U.S. Patent Application No. 61/564,733, filed Nov. 29, 2011, entitled "Novel Method for Preparing Samples for Sub-Surface Defect Review," the disclosure of which is hereby incorporated by reference.

BACKGROUND

1. Technical Field

The present invention relates to inspection and review systems to detect and analyze defects in manufactured substrates.

2. Description of the Background Art

Inspection processes are used at various steps during a semiconductor manufacturing process to detect defects on wafers and reticles. As the dimensions of semiconductor devices decrease, detection of defects of decreasing size has become necessary since even relatively small defects may cause unwanted aberrations in the semiconductor devices. The inspection process typically only involves detecting defects on the wafer or reticle and providing limited information about the defects such as location on the wafer or reticle, number of defects on the wafer or reticle, and sometimes defect size.

Defect review is often used to determine more information about individual defects than that which can be determined from inspection results. For instance, a defect review tool may be used to revisit defects detected on a wafer or reticle and to examine the defects further. Defect review typically involves generating additional information about defects at a higher resolution using either a high magnification optical system or a scanning electron microscope (SEM).

Some defects may be selected as candidates for sub-surface review. Sub-surface review generally involves manually navigating to the location of a selected defect, manually cutting the wafer or reticle to obtain a cross section, and high-resolution imaging of the cross section. The cut angle is usually determined based on a recommendation by a person who is familiar with the selected defect.

It is highly desirable to improve inspection and review systems to detect and analyze defects in manufactured substrates.

SUMMARY

One embodiment relates to a method of preparation of a sample of a substrate for sub-surface review using a scanning electron microscope apparatus. A defect at a location indicated in a first results file is re-detected, and the location of the defect is marked with at least one discrete marking point having predetermined positioning relative to the location of the defect. The location of the defect may be determined relative to the design for the device, and a cut location and a cut angle may be determined in at least a partly-automated manner using that information.

Another embodiment relates to a system for preparing a sample for sub-surface review. The system includes at least an inspection apparatus and a scanning electron microscope apparatus. The inspection apparatus is configured to inspect a device for defects, select defects for sub-surface review, and output data on the selected defects to a first results file. The scanning electron microscope apparatus is configured to re-detect a defect at a location indicated in the first results file, mark the location of the defect with at least one distinct marking point with predetermined positioning relative to the location of the defect, receive a design file with a design for the device, ascertain a cut location and a cut angle in at least a partly-automated manner using the design for the device, and revise the first results file to generate a second results file which includes the cut location and the cut angle.

Another embodiment relates to a method for marking a defect for review on a target substrate. A first results file is obtained from an inspection apparatus, and the defect for review is re-detected at a location indicated in the first results file. The location of the defect is marked with at least one distinct marking point with predetermined positioning and separation relative to the defect for review.

Other embodiments, aspects and feature are also disclosed.

BRIEF DESCRIPTION OF THE DRAWINGS

FIG. 6 shows a closer up view and lower-level structures relating to example defect of FIG. 5 in accordance with an embodiment of the invention.

FIG. 7A shows placement of a one-point mark relative to a defect of interest in accordance with an embodiment of the invention.

FIG. 7B shows placement of a two-point mark relative to a defect of interest in accordance with an embodiment of the invention.

FIG. 7C shows placement of a three-point mark relative to a defect of interest in accordance with an embodiment of the invention.

FIG. 7D shows placement of a four-point mark relative to a defect of interest in accordance with an embodiment of the invention.

Note that the figures are not necessarily to scale and are intended to illustrate embodiments of the invention for purposes of providing a clear explanation of the invention.

DETAILED DESCRIPTION

Figure 1:
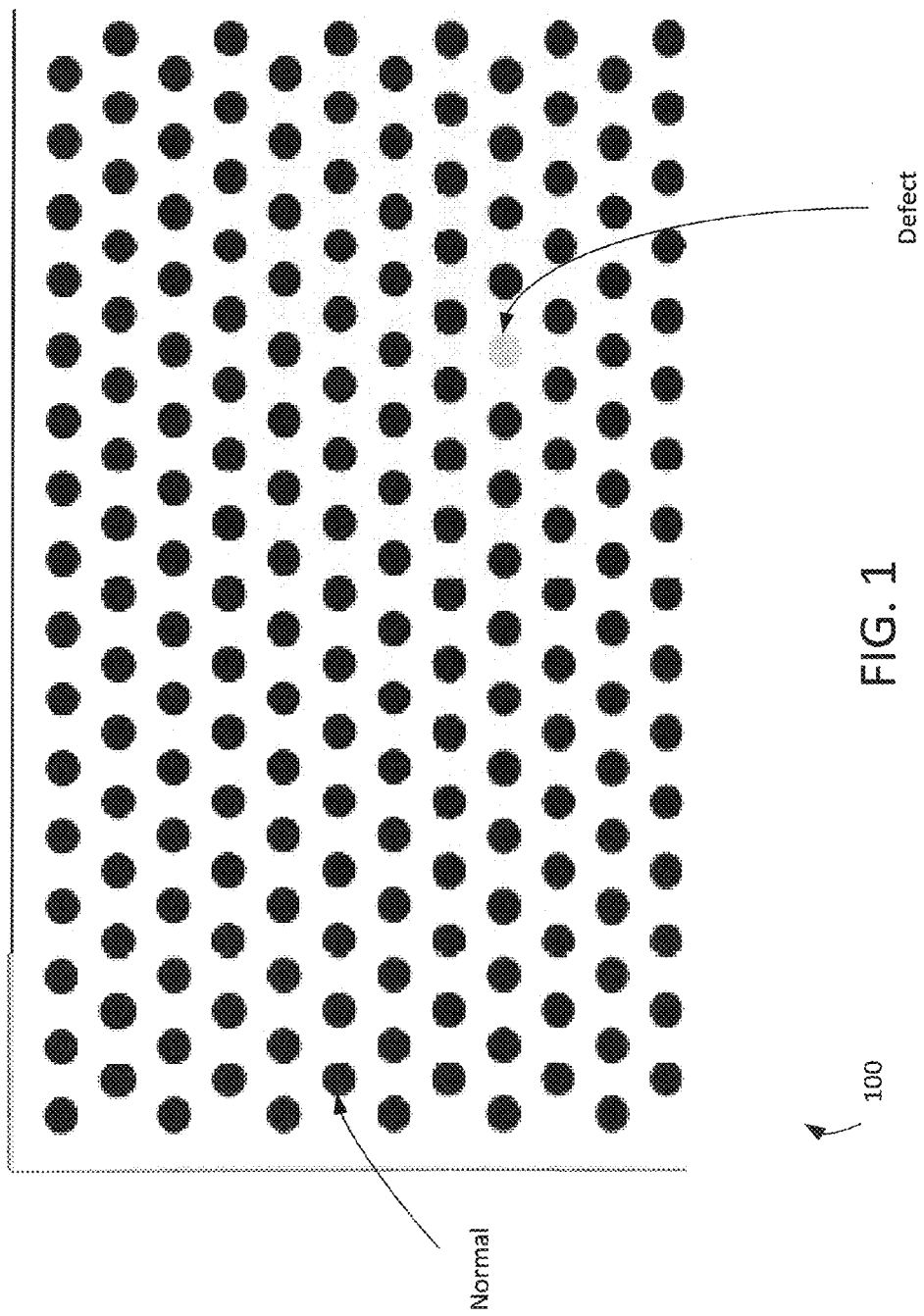
FIG. 1 shows an example defect in an array of electronic devices being formed on a target substrate.

FIG. 1 shows an example defect in an array of electronic devices being formed on a target substrate. In this example, the array 100, as depicted, includes a two-dimensional array of conductive plug features. The "normal" (non-defective) plug features in the array 100 are shown with darker-shaded circles, while the "defect" plug feature is shown with a lighter-shaded circle.

It is common to see such a voltage-contrast defect on an inspection machine. However, since the defect only shows up as a grey-level difference, the defect may not be visible on the review or FIB machine. This lack of visibility on re-imaging some defect types makes re-locating the defect problematic and is one reason why conventional practices run into difficulties. These difficulties may be overcome by using the systems and methods disclosed herein.

Figure 2:
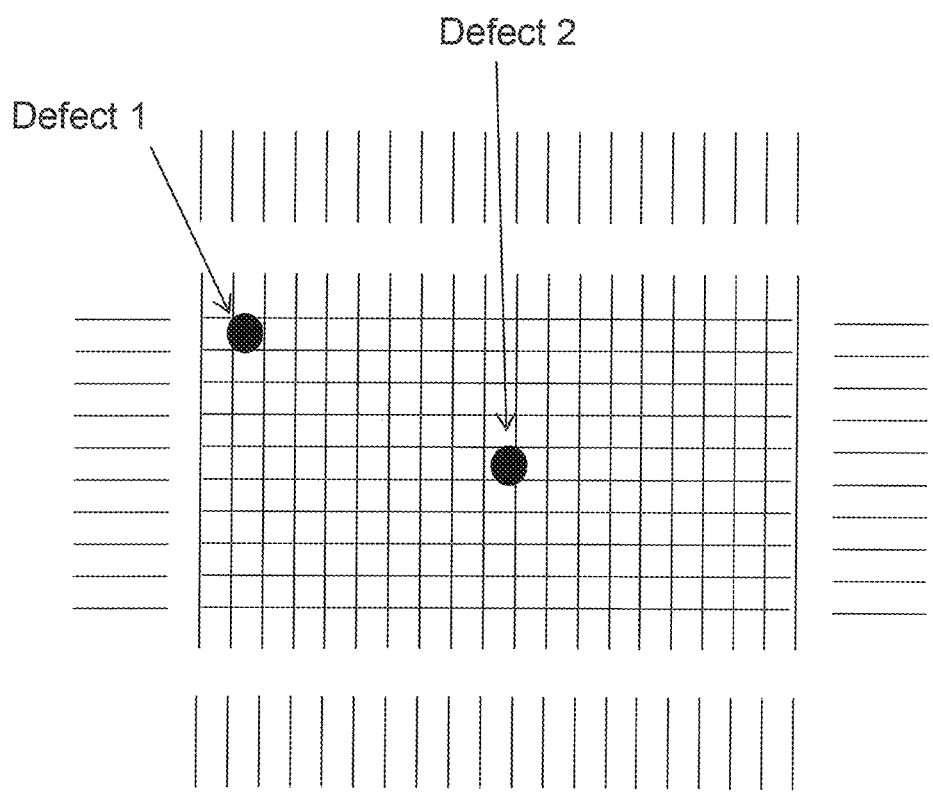
FIG. 2 depicts example defects at different locations in an array.

FIG. 2 depicts example defects at different locations in an array. The first example defect location is labeled as "Defect 1", and the second example defect location is denoted as "Defect 2". As shown, Defect 1 is in the vicinity of a corner of the array, while Defect 2 is in a middle of the array. The array corner is a "natural" or inherent fiducial (a feature from the design that serves as a reference point) which may be used as a point of reference for Defect 1. There is no inherent fiducial nearby Defect 2, and so Defect 2 requires a mark to be made so that it may be re-located.

Today, a typical flow from inspection to sub-surface review may be as follows: (i) Inspection (either optical or SEM based) of the target substrate; (ii) review imaging of the target substrate using an SEM; (iii) bin defects and identify candidates for sub-surface review on a focused ion beam system; (iv) use the review SEM to create rectangular burn marks (usually 0.5 to 2.0 microns in width), each rectangular burn mark delineating covering a region containing one or more of the candidate defects; (v) image the defects on the review SEM with the burn marks; (vi) transfer the target substrate and the images from the review SEM to the focused ion beam (FIB) tool; (vii) manually navigate to each burn mark in the FIB tool; (viii) manually cut based on the images using the FIB tool, where the cut angle is usually based on a recommendation of a person familiar with the defect; and (ix) high-resolution imaging of the sub-surface defect using either the FIB tool, or by removing a biopsy of the target substrate and imaging in a transmission electron microscope (TEM).

It has been determined that there are various issues in the above-discussed flow that contribute to the difficulty of performing sub-surface review of defects. First, as discussed above in relation to FIG. 1, sub-surface defects are often not visible on the FIB tool which is used for cross sectioning the sample. In such cases, the defect must be re-located with reference to a fiducial or other unique feature on the target substrate.

Second, as discussed above in relation to FIG. 2, some sub-surface defects may be in a middle of an array (not within the field of view of an array corner). For these defects, there may be no nearby reference point in the design (i.e. no inherent fiducial). As a result, rectangular burn marks are conventionally used to delineate areas within which the defects are located, and the defects are located by searching within the marked rectangular areas.

However, applicants have determined that the marked rectangular areas are imprecise, non-standard, and provide limited information as to the locations of the defects. For example, locating a 20 nm size defect in a 1,000 nm width burn mark may be practically infeasible.

Hence, most defect candidates for sub-surface review are chosen near a design reference point on the target substrate, so that the design reference point provides an inherent fiduciary. As a result of needing to be in the vicinity of a design reference point, it is difficult to review sub-surface defects inside arrays where there are no inherent fiducials near the defect.

Another issue is that burn marks from a SEM may dissipate depending on the layer. Hence, if there is a delay between the marking and the FIB cutting, then the mark may be gone.

Another issue is that the proper cutting angle for the manual cut is often unknown or inaccurately estimated. Knowing which angle to cut currently requires expert engineering knowledge that may not be present at the time of the cutting. Current industry practice is to create a drawing for each defect that the person doing the cutting can use as a guide. This is a highly manual and ad hoc procedure that results in a low percentage of successful cuts.

The present disclosure provides systems and methods to improve the precision and reliability of the sample preparation for sub-surface defect review. An innovative alignment technique is disclosed that enables precise and reliable alignment within an FIB tool for sample preparation. The alignment technique is applicable even to defect locations within an array without unique sites therein.

In addition to precision alignment to a defect location within the FIB tool, the present disclosure also provides for the non-manual determination of cut angles. This is done using data that is transferred from the review SEM system to the FIB system. The data may include design data, data on the defects of interest, and data on various alignment markers.

Figure 3:
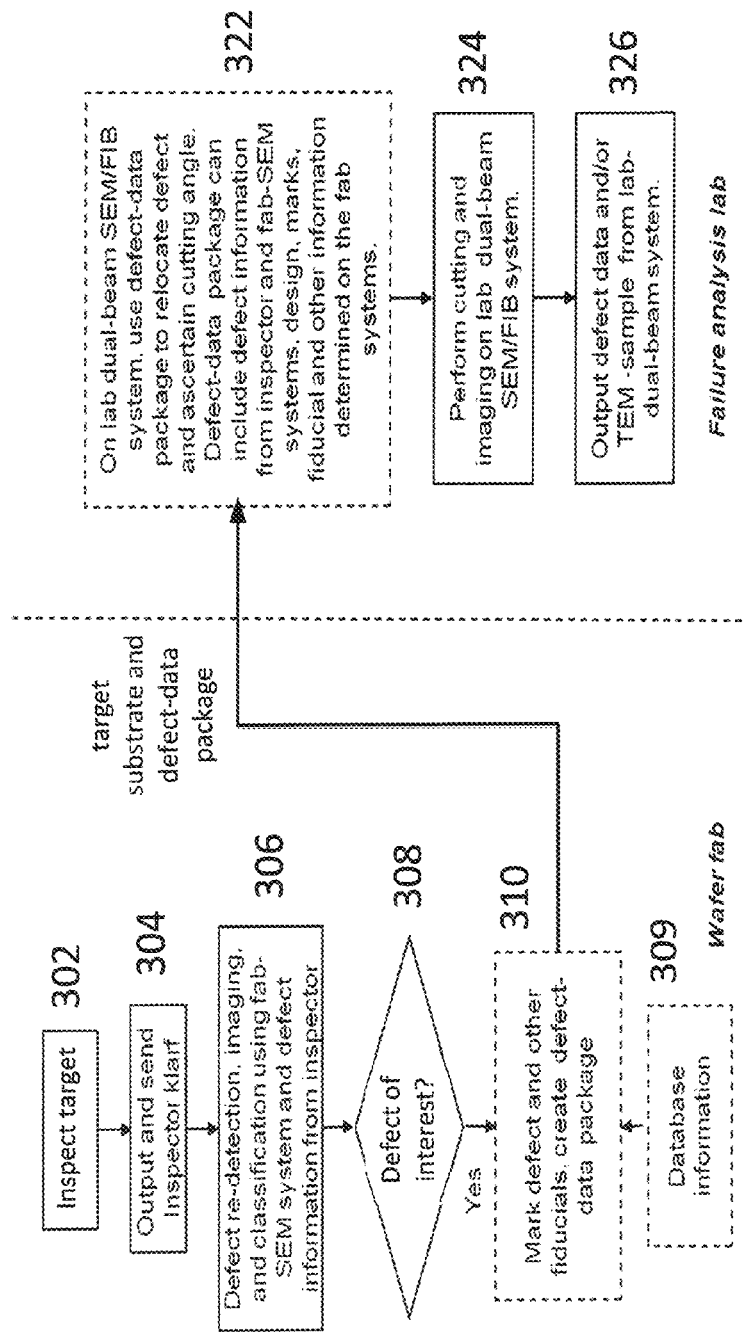
FIG. 3 is a flow chart showing a method of sample preparation for sub-surface review in accordance with an embodiment of the invention.

FIG. 3 is a flow chart showing a method of sample preparation for sub-surface review in accordance with an embodiment of the invention. The left side of the figure shows steps (302-310) that may be performed at a wafer fabrication facility, and the right side shows steps (322-326) that may be performed, for example, at a failure analysis laboratory.

Per block 302, a target semiconductor wafer or reticle (i.e. a target manufactured substrate) may be inspected. The inspection may be performed, for example, using an optical inspection machine or a scanning electron microscope (SEM) inspection machine. Such inspection machines are available, for example, from KLA-Tencor Corporation of Milpitas, Calif. The inspection procedure may be performed in accordance with an inspection recipe for the target substrate. Of the defects detected during the inspection, select defects may be binned for sub-surface review. Results from the inspection, including the defects binned for sub-surface review, may be stored in a first results file (for example, in a "KLA results file" or "klarf").

Per block 304, the inspection machine may output and send the first results file (Inspector klarf) to a review machine. The review machine may be, for example, a SEM review machine. Such a review machine is available, for example, from KLA-Tencor Corporation of Milpitas, Calif. Alternatively, the functionalities of the inspection and review machines may be a single SEM machine which performs an inspection procedure to function as an inspection machine and performs a review procedure to function as a review machine. In this case, the first results file from the inspection procedure would be accessed during the review procedure.

Per block 306, the review machine may re-detect and image defects which were previously detected by the inspection machine and about which data was stored in the first results file. The review machine may also perform a preliminary classification of the defects. In particular, the defects binned for sub-surface review may be re-detected, imaged, and preliminarily classified.

Per block 308, a determination may be made by the review machine as to whether a defect is a suspected defect of interest for sub-surface review. The determination may be based, for example, on the location and preliminary classification of the defect. Such a determination may be performed for each defect in the first results file.

Per block 309, design data may be obtained from a design information database. The design data relates to features, including sub-surface features, that are being manufactured on the target substrate.

Per block 310, if the defect is a suspected defect of interest, then the defect (and fiducials) may be marked. The fiducials may include, for example, an array corner which is nearby a defect. A mark may be formed using carbon-burn marking, gas-assisted etching, FIB etching, or using other methods. Exemplary marks are described further below in relation to FIGS. 7A, 7B, 7C, 7D, 8A and 8B. The exemplary marks include one or multiple distinct marking points (which are preferably separate from each other and do not overlap the defect location) having predetermined positioning relative to the defect location.

In addition, in one embodiment, the cutting location and cutting angle for a defect may be ascertained in a semi-automated or fully automated manner. The determination of the cutting location and angle may be performed by: (a) re-imaging the defect with the marking point(s) in a fully or partly automated manner; (b) measuring the defect distance of the defect to the marking point(s) in a fully or partly automated manner; (c) aligning an image of the design to the defect and the marking point(s) in a fully or partly automated manner; and (d) using the design data and any further information about the defect type in a manual, semi-automated, or fully-automated way to predict or ascertain an optimal cutting angle to view the defect in cross-section.

A defect-data package may be created. The defect-data package may include a second results file and also design data from the design information database. The second results file may include the locations of the marks relative to associated defects and may also include cutting locations and cutting angles for those defects. In one implementation, the second results file may be created by adding further information to the first results file.

After the marking of the target substrate and the creation of the defect-data package, the target substrate and the defect-data package may be provided from the fabrication facility (fab) to the failure analysis laboratory (lab). As mentioned above, the defect-data package may include: defect information from the inspection machine and the SEM systems at the fabrication facility; design data from the design information database; locations and images of at least one die corner and alignment sites to help globally synchronize the coordinate systems between the fab and failure analysis systems; locations and images of the defect marks and related fiducials; the cutting locations and cutting angles; and other information determined by the fab systems. The steps at the fabrication facility described below may be performed in a manual, semi-automated, or fully automated way.

Per block 322, after aligning the coordinate system of the FIB instrument using the locations and images of the die corners and alignment sites, the locations and images of the defect marks and related fiducials in the defect-data package may be used by a focused ion beam (FIB) instrument at the lab to relocate a defect of interest and ascertain a cutting location and a cutting angle for that defect of interest. In one embodiment, a dual-beam SEM/FIB system may include the FIB instrument and an SEM instrument. The cutting location and the cutting angle may be obtained from the defect-data package if they were ascertained previously by the fab systems, or they may be ascertained by the system at the failure analysis laboratory.

Per block 324, cutting may be performed at the defect of at the ascertained cutting angle. In addition, imaging of defect after the cut may be performed. In one embodiment, the cutting and imaging may be performed using a dual-beam SEM/FIB system, where the cutting is performed by the FIB instrument, and the imaging is performed by the SEM instrument.

Per block 326, the sub-surface defect images and other data may be output to a third results file. In addition, the cut sample may be provided for further analysis. For example, the further analysis may include analysis of a cross-sectional sample on a transmission electron microscope (TEM) instrument.

Figure 4:
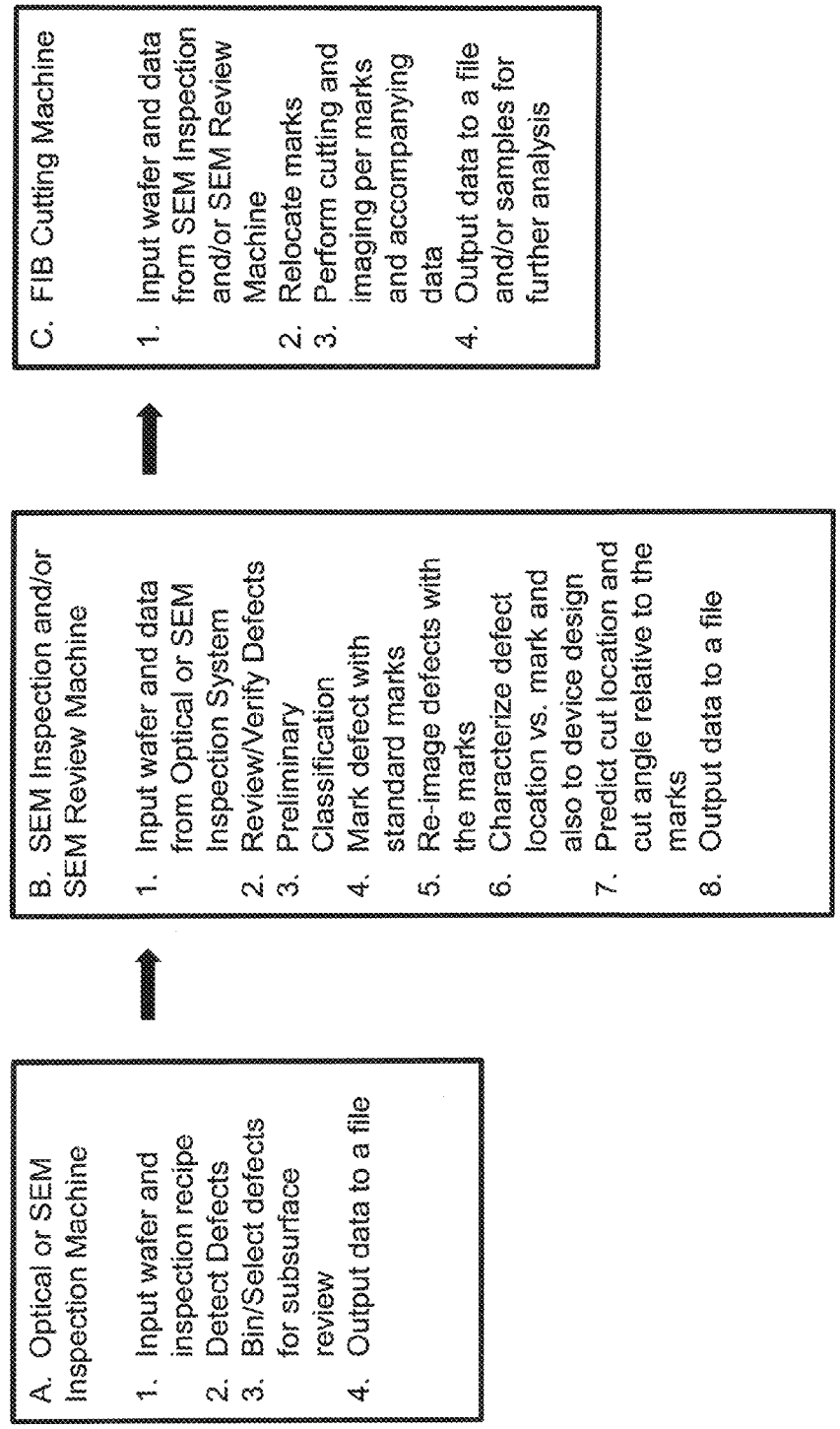
FIG. 4 is a flow diagram showing a method of sample preparation for sub-surface review in accordance with an embodiment of the invention.

FIG. 4 is a flow diagram showing a method of sample preparation for sub-surface review in accordance with an embodiment of the invention. The flow diagram of FIG. 4 shows steps performed on specific machines.

The steps in block A may be performed on an optical or SEM inspection machine. The steps in block A include: (1) inputting the wafer (or reticle) and an associated inspection recipe into the inspection machine; (2) detecting defects on the wafer (or reticle) in accordance with the inspection recipe; (3) binning or otherwise selecting defects for sub-surface review; and (4) outputting the inspection data to a file (a first results file).

The steps in block B may be performed on an SEM inspection and/or an SEM review machine. The steps in block B include: (1) inputting the wafer (or reticle) and the first results file (data from Optical or SEM Inspection System); (2) reviewing and verifying the defects; (3) performing a preliminary classification of the defects, where defects of interest may be binned or otherwise selected; (4) marking the defects of interest with predetermined (standard) marks; (5) re-imaging the defects of interest with the associated marks; (6) characterizing the defect locations relative to the associated marks and also to the device design; (7) ascertaining (predicting) cut location and cut angle relative to the marks (and fiducials) in an computer-automated manner (with little or preferably no input needed from a human expert); and (8) outputting defect-related data, including the cut location and cut angle information, into a file (the second results file) which may be included, along with design data, in a defect-data package.

The steps in block C may be performed on an FIB cutting machine. In one embodiment, the FIB cutting machine may be a dual-beam SEM/FIB machine. The steps in block C include: (1) inputting the wafer (or reticle) and the defect-data package (data from SEM Inspection and/or SEM Review Machine); (2) re-locating the marks; (3) performing cutting and imaging per the marks and accompanying data (including the cut angles); and (4) outputting the sub-surface defect images and other data may be output to a third results file, and/or the cut sample may be provided for further analysis, for example, using a TEM.

Figure 5:
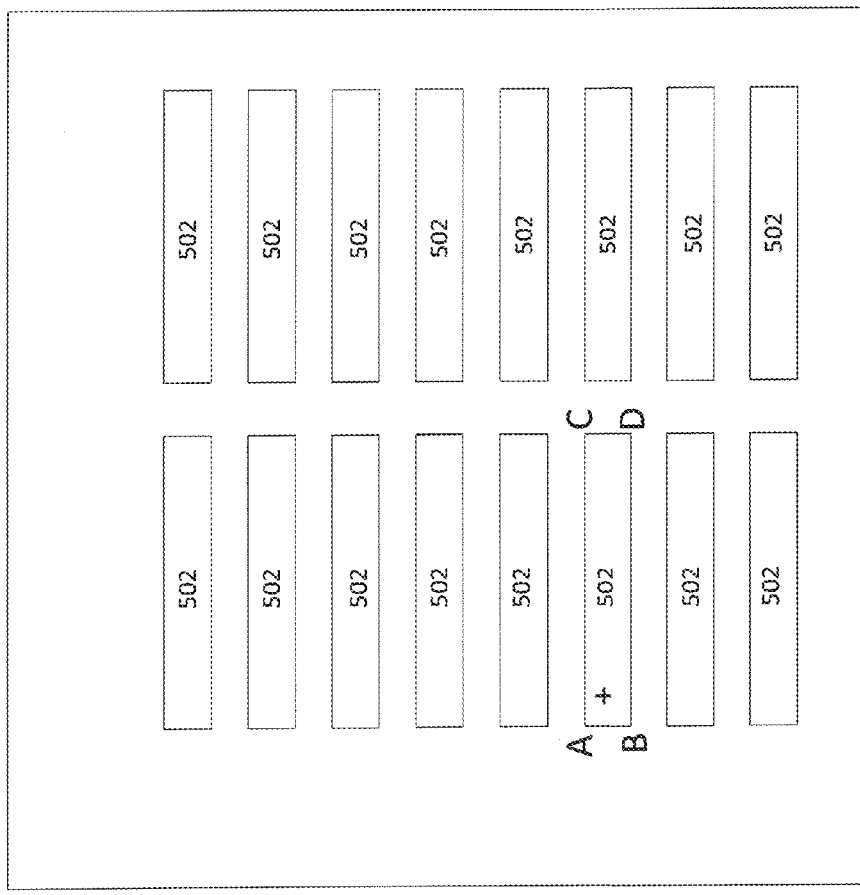
FIG. 5 shows an example defect location on a target substrate in accordance with an embodiment of the invention.

FIG. 5 shows an example defect location on a target substrate 500 in accordance with an embodiment of the invention. In this example, the target substrate 500 includes a plurality of array banks 502. The example defect location is denoted by a "+" in the diagram. The defect is located in a particular rectangular array bank 502 which has its corners labeled "A", "B", "C", and "D" in the diagram. In accordance with an embodiment of the invention, the defect-data package may include an indication of the defective array bank and the defect-to-array-corner coordinates (i.e. the Cartesian coordinates of the vectors from the defect to each of the array bank corners).

FIG. 6 shows a closer-up view and lower-level structures relating to example defect of FIG. 5 in accordance with an embodiment of the invention. Shown in FIG. 6 are sub-surface horizontal lines which are gate lines 602 for the electronic devices and sub-surface diagonal lines which are active areas 604 for the electronic devices. These lines may be determined from the design data. Note that the defect in FIG. 6 is the same voltage-contrast defect as shown in FIG. 1.

The voltage-contrast defect may be determined to be due to various causes. In a first example, the defect may be determined to be a plug-to-plug short circuit. In this case, the cut angle may be ascertained to be parallel to the gate line 602. As a second example, the defect may be determined to be a plug-to-gate short circuit. In this case, the cut angle may be ascertained to be perpendicular to the gate line 602. In a third example, the defect may be determined to be a junction-leakage defect. In this case, the cut angle may be ascertained to be at a diagonal along the lower-level active structures 604.

FIG. 7A shows placement of a one-point mark relative to a defect of interest in accordance with an embodiment of the invention. The defect position is indicated by the solid circle, and the location of the marking point is indicated by the open circle. The relative displacement vector between the marking point and the defect is predetermined. For example, it may be given by a number of pixels (at a predetermined magnification and resolution) in a predetermined direction (given a predetermined orientation of the target substrate).

FIG. 7B shows placement of a two-point mark relative to a defect of interest in accordance with an embodiment of the invention. The defect position is again indicated by the solid circle, and the location of the two marking points are indicated by the open circles. The relative displacement vectors between each of the two marking points and the defect are predetermined. For example, it may be given by a number of pixels (at a predetermined magnification and resolution) in a predetermined direction (given a predetermined orientation of the target substrate). In an exemplary embodiment, the two marking points may be on opposite sides of the defect location and may be an equal distance away from the defect location.

FIG. 7C shows placement of a three-point mark relative to a defect of interest in accordance with an embodiment of the invention. The defect position is again indicated by the solid circle, and the location of the three marking points indicated by the open circles. The relative displacement vectors between each of the three marking points and the defect are predetermined. For example, it may be given by a number of pixels (at a predetermined magnification and resolution) in a predetermined direction (given a predetermined orientation of the target substrate). In an exemplary embodiment, the three marking points may be equidistant from the defect location (i.e. on a virtual circle around the defect location) and be spread such that there is an angle $\alpha$ of 120 degrees formed by two marking points with the defect location at the vertex.

FIG. 7D shows placement of a four-point mark relative to a defect of interest in accordance with an embodiment of the invention. The defect position is again indicated by the solid circle, and the location of the four marking points are indicated by the open circles. The relative displacement vectors between each of the four marking points and the defect are predetermined. For example, it may be given by a number of pixels (at a predetermined magnification and resolution) in a predetermined direction (given a predetermined orientation of the target substrate). In an exemplary embodiment, the four marking points may form a rectangle with the defect location at the center of the rectangle.

Figure 8A:
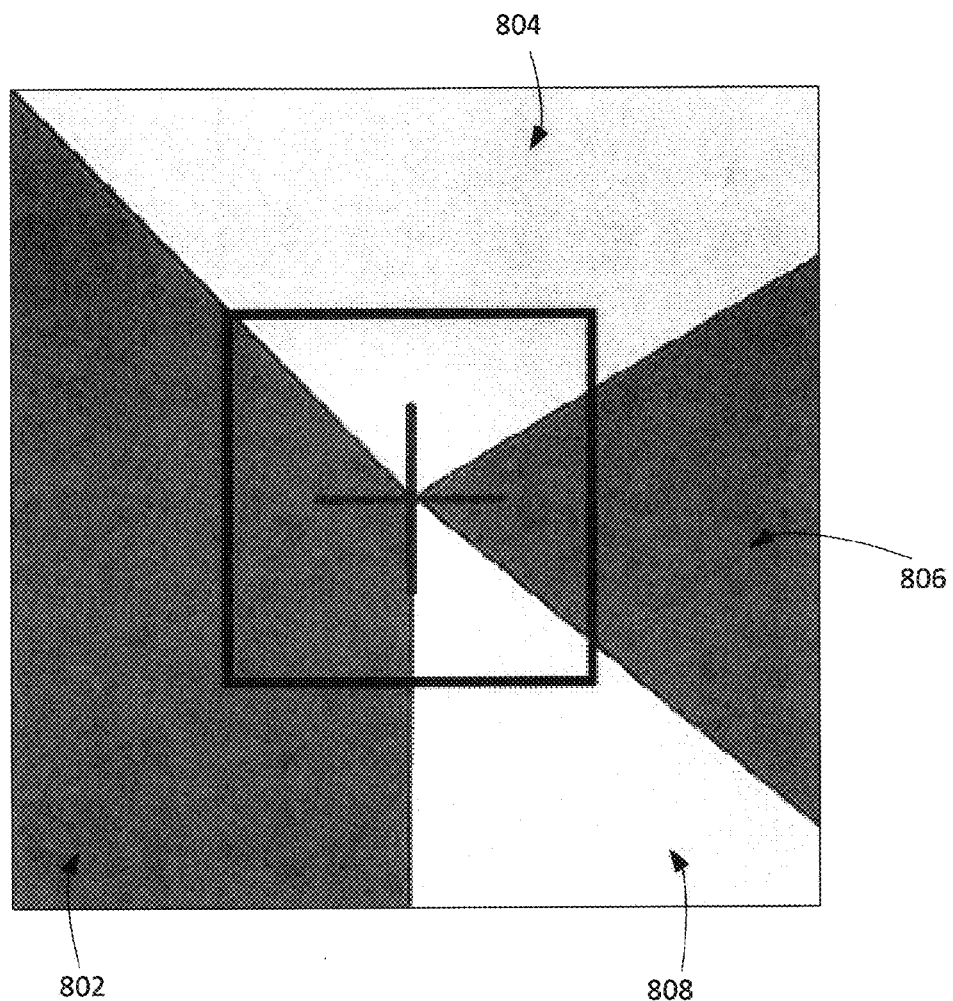
FIG. 8A depicts an exemplary geometrical pattern for a single point of a mark in accordance with an embodiment of the invention.

FIG. 8A depicts an exemplary geometrical pattern for a single marking point in accordance with an embodiment of the invention. The geometrical pattern includes alternating "darker" and "lighter" marking regions around a center location. The marking regions may be formed by carbon-burn marking, gas-assisted etching, FIB etching, or using other methods. The center location is indicated by the cross-hair in FIG. 8A. The darker regions show up as darker in an SEM image, while the lighter regions show up as lighter in the SEM image.

In the exemplary embodiment depicted, there are two darker polygon-shaped regions (802 and 806) and two lighter polygon-shaped regions (804 and 808). These four polygonal regions together form a rectangle with the center location of the marking point at the center of the rectangle.

In the particular embodiment shown, the first darker polygonal region 802 has a first side on the left edge of the rectangle, a second side going from the upper left corner to the center of the rectangle, a third side extending from the center of the rectangle to the middle of the bottom edge of the rectangle, and a fourth side going from the middle of the bottom edge to the lower left corner of the rectangle. The first lighter polygonal region 804 has a first side on the top edge of the rectangle, a second side going from the upper right corner to a first point which is part of the way down the right side of the rectangle, a third side going from the first point on the right edge to the center of the rectangle, and a fourth side extending from the center of the rectangle to the upper left corner of the rectangle. The second darker polygonal region 806 has a first side going from the first point on the right edge to a second point further down the right edge, a second side going from the second point on the right edge to the center of the rectangle, and a third side going from the center of the rectangle to the first point on the right edge. Finally, the second lighter polygonal region 808 has a first side going from the first point on the right edge to a second point further down the right edge, a second side going from the second point on the right edge to the center of the rectangle, and a third side going from the center of the rectangle to the first point on the right edge.

Figure 8B:
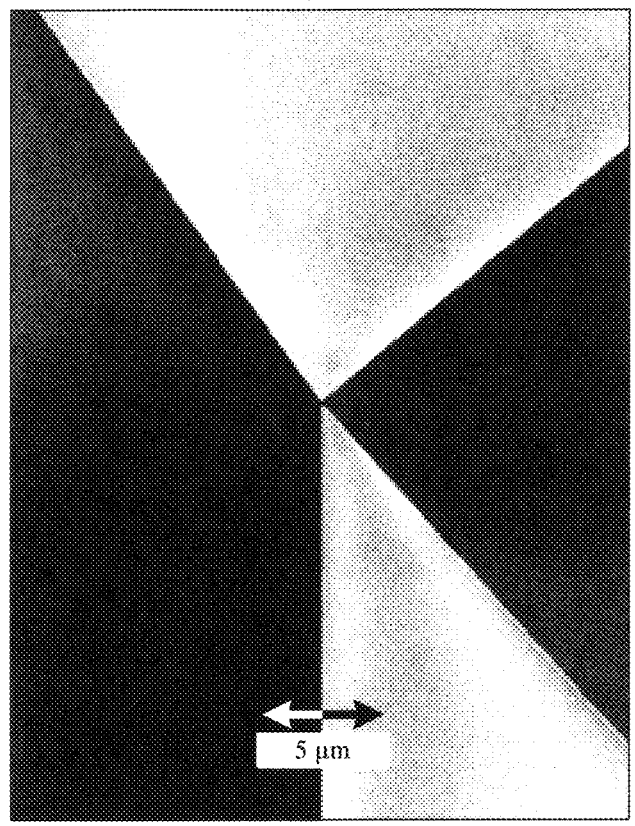
FIG. 8B shows the exemplary geometrical pattern of FIG. 8A as formed on a wafer in accordance with an embodiment of the invention.

FIG. 8B shows the exemplary geometrical pattern of FIG. 8A as formed on a wafer in accordance with an embodiment of the invention. The scale of the geometrical pattern is indicated by the 5 micron long line double-sided arrow shown in FIG. 8B. As seen, the center location of the marking point (which may be used for one point of a multiple-point mark) may be advantageously re-located to a sub-micron accuracy.

CONCLUSION

The above disclosure provides innovative systems and methods for the preparation of samples for sub-surface defect review. The samples may be samples of a semiconductor wafer or a reticle.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of preparation of a sample of a substrate for sub-surface review using a scanning electron microscope apparatus, the method comprising:
  obtaining a first results file from an inspection apparatus, wherein the first results file includes locations of defects detected in a device being manufactured by the inspection apparatus;
  re-detecting a defect at a location indicated in the first results file;
  marking on the substrate the location of the defect with multiple discrete and separate marking points, each said marking point having predetermined positioning relative to the location of the defect that is given by a number of pixels and a predetermined direction;
  receiving a design file with a design for the device;
  determining the location of the defect relative to the design for the device;
  ascertaining a cut location and a cut angle in an at least a partly-automated manner using the design for the device; and
  revising the first results file to generate a second results file which includes the cut location and the cut angle.

2. The method of claim 1 further using a focused ion beam apparatus and further comprising:
  performing cutting at the cut location and the cut angle.

3. The method of claim 2 further comprising:
  transferring the substrate and communicating the second results file from the scanning electron microscope apparatus to the focused ion beam apparatus, wherein the scanning electron microscope apparatus and the focused ion beam apparatus are separate systems; and
  aligning a coordinate system of the focused ion beam apparatus with a coordinate system of the scanning electron microscope apparatus using locations and images of a die corner and alignment sites prior to ascertaining the cut location and the cut angle.

4. The method of claim 2, wherein the scanning electron microscope apparatus and the focused ion beam apparatus are integrated in a single system.

5. The method of claim 2 further comprising:
  performing imaging to obtain an image of the defect after the cutting is performed; and
  generating a third results file including the image of the defect.

6. The method of claim 5 further using a transmission electron microscope apparatus and further comprising:
  obtaining the third results file; and
  performing imaging using the transmission electron microscope to obtain a cross-sectional image of the defect.

7. The method of claim 1, wherein the number of pixels is at a predetermined magnification and resolution.

8. The method of claim 1, wherein each of the multiple marking points comprises a geometrical pattern which has alternating darker and lighter marking regions around a center location, each said marking region being a polygon having a vertex at the center location.

9. The method of claim 1, wherein the defect is in an array and is located outside of a field of view from a corner of the array.

10. The method of claim 9, wherein the defect comprises a voltage-contrast defect.

11. The method of claim 1, wherein the marking is performed using carbon-burn marking.

12. A system for preparing a sample for sub-surface review, the system comprising:
  an inspection apparatus configured to inspect a device for defects, select defects for sub-surface review, and output data on the selected defects to a first results file;
  a scanning electron microscope apparatus configured to re-detect a defect at a location indicated in the first results file, mark on the sample the location of the defect with at least one distinct marking point with predetermined positioning relative to the location of the defect, receive a design file with a design for the device, ascertain a cut location and a cut angle in at least a partly-automated manner using the design for the device, and revise the first results file to generate a second results file which includes the cut location and the cut angle,
  wherein said at least one distinct marking point comprises a geometrical pattern which has alternating darker and lighter marking regions around a center location, each said marking region being a polygon having a vertex at the center location.

13. The system of claim 12 further comprising:
  a focused ion beam apparatus configured to performing cutting at the cut location and the cut angle relative to the mark for the defect.

14. The system of claim 13, wherein the scanning electron microscope apparatus and the focused ion beam apparatus are separate systems, wherein the substrate and the second results file are transferred from the scanning electron microscope apparatus to the focused ion beam apparatus, and wherein a coordinate system of the focused ion beam apparatus is aligned with a coordinate system of the scanning electron microscope apparatus using locations and images of a die corner and alignment sites prior to ascertaining the cut location and the cut angle.

15. The system of claim 13, wherein the scanning electron microscope apparatus and the focused ion beam apparatus are integrated in a single apparatus.

16. A method for marking a defect for review on a target substrate, the method comprising:
  obtaining a first results file from an inspection apparatus, wherein the first results file includes locations of defects detected in the target substrate by the inspection apparatus, wherein the defects detected include the defect for review;
  re-detecting the defect for review at a location indicated in the first results file; and
  marking the location of the defect with a mark on the target substrate that comprises at least one distinct marking point with predetermined positioning and separation relative to the defect for review, wherein said at least one distinct marking point comprises a geometrical pattern which has alternating darker and lighter marking regions around a center location, each said marking region being a polygon having a vertex at the center location.

17. The method of claim 16, wherein the mark comprises multiple distinct and separate marking points with predetermined positioning and separation relative to the defect for review.

18. The method of claim 16, wherein the marking regions comprise triangles and quadralaterals.

19. The method of claim 18, wherein the marking regions comprise one dark triangle across from one dark quadrilateral and one light triangle across from one light quadrilateral.

20. The method of claim 16, wherein the marking is performed using carbon-burn marking.

\* \* \* \* \*